United States Patent
Nishio et al.

(10) Patent No.: US 8,290,734 B2
(45) Date of Patent: Oct. 16, 2012

(54) SEMICONDUCTOR INTEGRATED CIRCUIT

(75) Inventors: Shigeru Nishio, Kawasaki (JP); Naoaki Naka, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 276 days.

(21) Appl. No.: 11/907,673

(22) Filed: Oct. 16, 2007

(65) Prior Publication Data

US 2008/0116937 A1 May 22, 2008

(30) Foreign Application Priority Data

Nov. 20, 2006 (JP) ................................. 2006-313457

(51) Int. Cl.
G01R 31/00 (2006.01)
G01R 31/14 (2006.01)
G01R 31/28 (2006.01)
H03K 5/22 (2006.01)
H03K 5/153 (2006.01)

(52) U.S. Cl. ........................ 702/117; 327/90; 714/724

(58) Field of Classification Search .................. 702/117; 714/724; 327/90
See application file for complete search history.

(56) References Cited

U.S. PATENT DOCUMENTS

| | | | | |
|---|---|---|---|---|
| 6,112,163 A | * | 8/2000 | Oowaki et al. | 702/117 |
| 6,199,025 B1 | * | 3/2001 | Fujii et al. | 702/117 |
| 6,377,065 B1 | * | 4/2002 | Le et al. | 324/750.01 |
| 6,490,700 B1 | * | 12/2002 | Oshima et al. | 714/718 |
| 6,539,324 B2 | * | 3/2003 | Miyatake et al. | 702/117 |
| 6,604,058 B2 | * | 8/2003 | Nakayama | 702/117 |
| 6,735,454 B1 | * | 5/2004 | Yu et al. | 455/574 |
| 6,853,177 B2 | * | 2/2005 | Shibayama et al. | 324/76.48 |
| 2002/0145441 A1 | * | 10/2002 | Shiraishi | 324/765 |
| 2004/0255224 A1 | * | 12/2004 | Yabe | 714/763 |
| 2005/0080580 A1 | * | 4/2005 | Kantake | 702/117 |

FOREIGN PATENT DOCUMENTS

JP 59-116064 7/1984
JP 62-115857 5/1987

* cited by examiner

*Primary Examiner* — Janet Suglo
(74) *Attorney, Agent, or Firm* — Fujitsu Patent Center

(57) ABSTRACT

A semiconductor integrated circuit including: a data input circuit inputting a data input signal from outside and outputting the signal; a comparison value register memorizing an expectation value of the output signal varying in accordance with an input to the data input circuit; and a comparing circuit comparing a value in accordance with a switching number of the output signal of the data input circuit and the expectation value, is provided.

6 Claims, 6 Drawing Sheets

F I G. 1
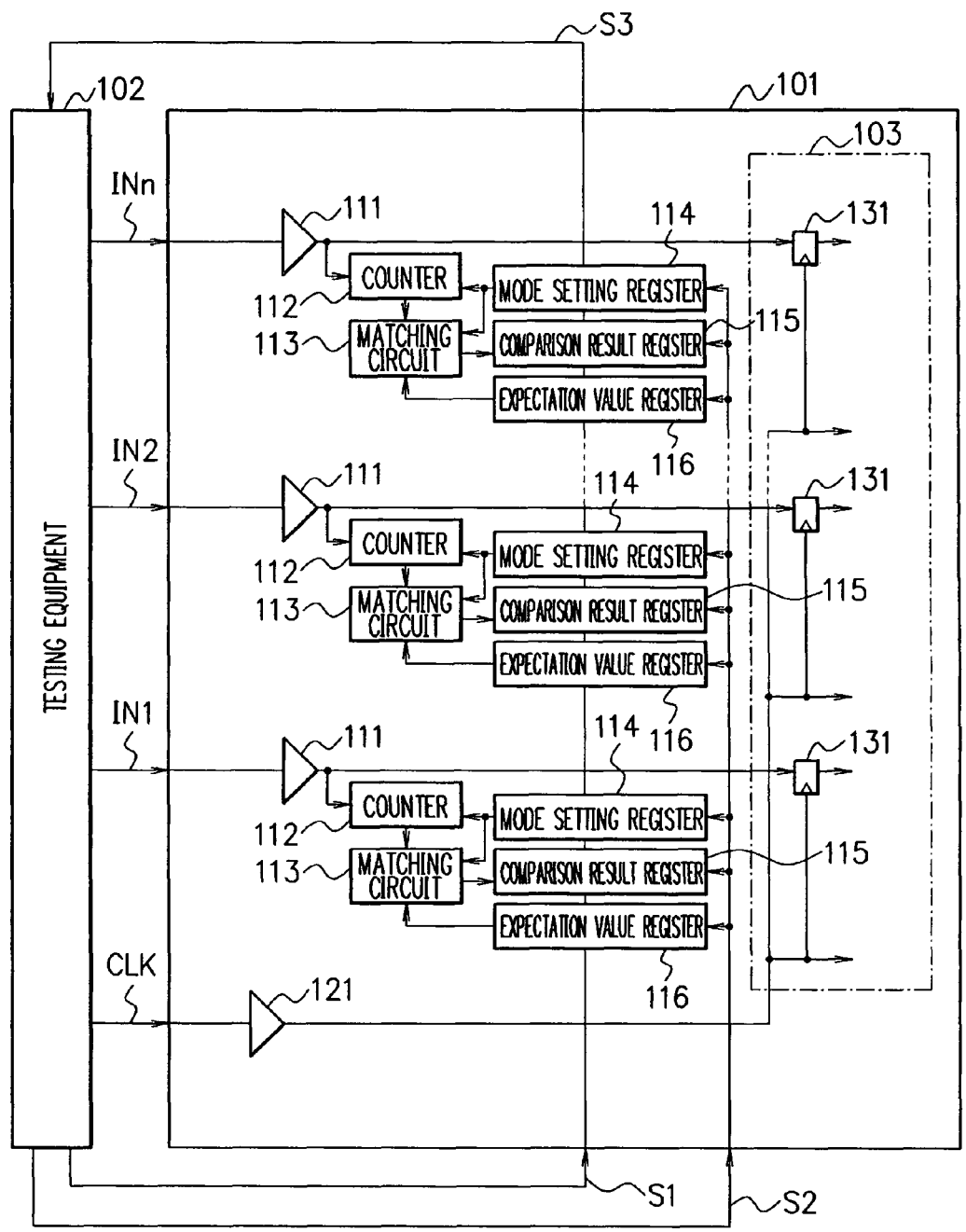

SEMICONDUCTOR INTEGRATED CIRCUIT

CROSS-REFERENCE TO RELATED APPLICATIONS

This application is based upon and claims the benefit of priority from the prior Japanese Patent Application No. 2006-313457, filed on Nov. 20, 2006, the entire contents of which are incorporated herein by reference.

BACKGROUND OF THE INVENTION

1. Field of the Invention

The present invention relates to a semiconductor integrated circuit, and more particularly, to a semiconductor integrated circuit inputting a data input signal.

2. Description of the Related Art

FIG. 6 is a time chart showing three types of signals outputted by testing equipment to a semiconductor integrated circuit. The testing equipment can output three types of signals, namely a Non-Return to Zero signal, a Return to Zero signal and a short-pulse signal. Cycle times T1, T3, T4 show a signal indicating data of "1", respectively. The cycle time T2 shows a signal indicating data of "0 (zero)". The Non-Return to Zero signal changes once in each of the cycle times T1, T2, T3 being cycle times in which data changes. The Return to Zero signals change twice in each of the cycles T1, T3, T4 indicating the data of "1". The short-pulse signal is generated by combining (exclusive OR operation) the two Return to Zero signals having mutually different phase.

FIG. 7 is a circuit diagram showing input circuits 111 and an internal logic circuit 103 in the semiconductor integrated circuit. Via n-pieces of the input circuits 111, n-bits of data input signals IN1 to INn are inputted into data input terminals of n-pieces of flip-flops 131 in the internal logic circuit 103, respectively. A clock signal CLK is inputted into clock terminals of the n-pieces of flip-flops 131 via an input circuit 121.

When testing the input circuits 111 and the input circuit 121, the data input signals IN1 to INn and the clock signal CLK are inputted from the testing equipment. At that time, as shown in FIG. 8, as data input signals IN1 to INn, the Non-Return to Zero signals are used and, as a clock signal CLK, the Return to Zero signal is used. However, along with recent increase in speed in the semiconductor integrated circuits, the pulse width at practical use is becoming shorter than that of the Non-Return to Zero signal that a general testing equipment can generate, requiring the test to be performed by inputting the data input signals IN1 to INn having a shorter pulse width.

FIG. 8 is a timing chart showing an example of the data input signals IN1 to INn and the clock signal CLK. When the semiconductor integrated circuit inputs the clock signal CLK and the data input signals IN1 to INn, a rule called a setup time TS and a holdtime TH has to be observed. For instance, the flip-flops 131 latch to memorize the data input signals IN1 to INn in synchronization with a rising edge of the clock signal CLK. At this time, the setup time TS is a time period in which the data of the data input signals IN1 to INn has to be fixed before the rising of the clock signal CLK. The holdtime TH is a time period in which the data of the data input signals IN1 to INn has to be fixed after the rising of the clock signal CLK. However, the data input signals IN1 to INn that the general testing equipment outputs have a very large phase variation (skew) TT, in which the data input signals IN1 to INn themselves also have a large phase variation mutually, making it difficult to observe the rule of the setup time TS and the holdtime TH. Therefore, it is difficult to test the semiconductor integrated circuit inputting the data input signals IN1 to INn having the short pulse width.

FIG. 9 is a circuit diagram of the semiconductor integrated circuit having signal generation circuits 901 for the test, which has the signal generation circuits 901 and selectors 902 in addition to FIG. 7. The signal generation circuit 901 generates and outputs the data input signal based on the clock signal outputted by the input circuit 121. The selector 902 selects either the data input signal of the input circuit 111 or that of the signal generation circuit 901 to output the selected data input signal to the data input terminal of the flip-flop 131. Since the signal generation circuits 901 in the semiconductor integrated circuit generate the data input signals, the data input signals having a small phase variation are generated, so that the test of the semiconductor integrated circuit can be performed. However, in this method, the test of the data input signals having a small phase variation cannot be performed to the input circuit 111.

Further, in Japanese Patent Application Laid-Open No. Sho59-116064 (Patent document 1), there is described equipment testing a logic circuit by comparing data stored in a shift register incorporated in the logic circuit and an expectation value data.

Furthermore, in Japanese Patent Application Laid-Open No. Sho62-115857 (Patent document 2), there is described a semiconductor integrated circuit device including: an input terminal inputting a serial signal corresponding to each test mode, a serial-parallel converter circuit connected to the input terminal, and a test mode setting circuit connected to the serial-parallel converter circuit and having a decoder decoding a converted parallel output.

As described above, it is difficult for the testing equipment to output the data input signal having a small phase variation. Further, even if the semiconductor integrated circuit generates the data input signal internally, it is impossible to test the input circuit with the data input signal. Specifically, it is difficult to test the input circuit inside the semiconductor integrated circuit inputting the data input signal having the short pulse width.

SUMMARY OF THE INVENTION

An object of the present invention is to provide a semiconductor integrated circuit capable of testing an input circuit inside the semiconductor integrated circuit inputting a data input signal having a short pulse width.

A semiconductor integrated circuit according to the present invention includes: a data input circuit inputting a data input signal from outside and outputting the signal; a comparison value register memorizing an expectation value of the output signal varying in accordance with an input to the data input circuit; and a comparing circuit comparing a value in accordance with a switching number of the output signal of the data input circuit and the expectation value.

BRIEF DESCRIPTION OF THE DRAWINGS

FIG. 1 is a view showing a configuration example of a semiconductor integrated circuit according to a first embodiment of the present invention;

DETAILED DESCRIPTION OF THE PREFERRED EMBODIMENTS

First Embodiment

Figure 6:
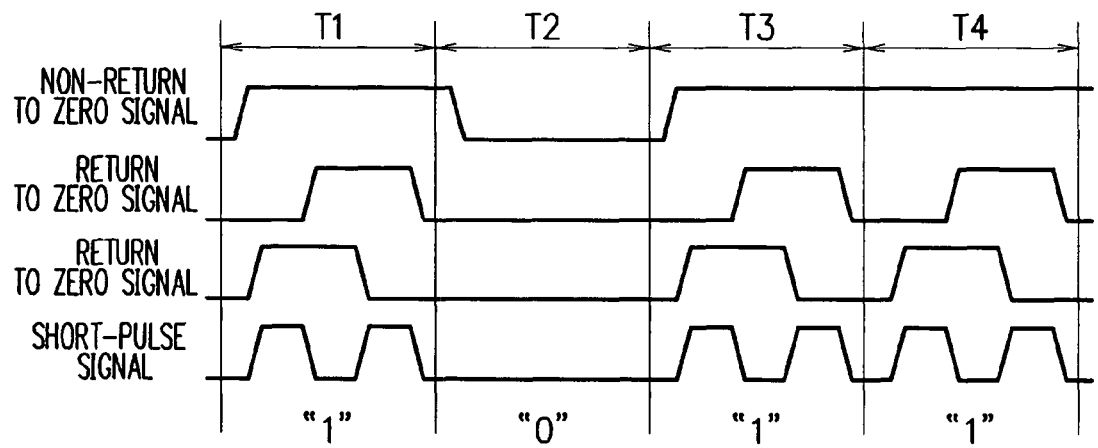
FIG. 6 is a time chart showing three types of signals outputted by the testing equipment to the semiconductor integrated circuit.
Figure 7:
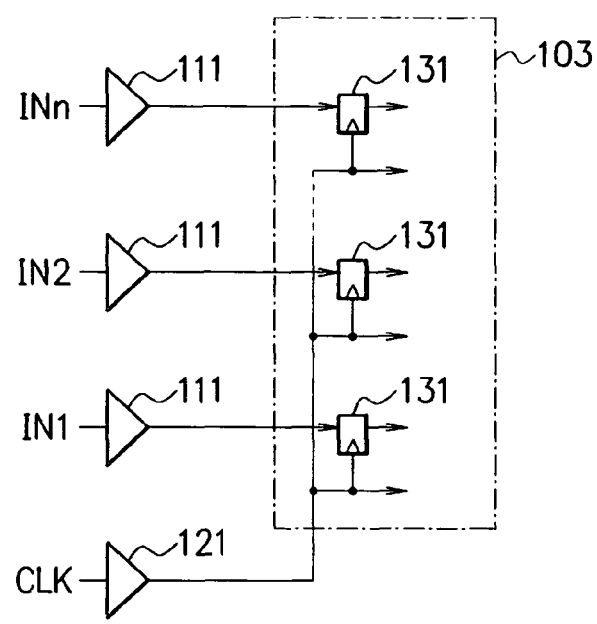
FIG. 7 is a circuit diagram showing input circuits and an internal logic circuit in the semiconductor integrated circuit.
Figure 8:
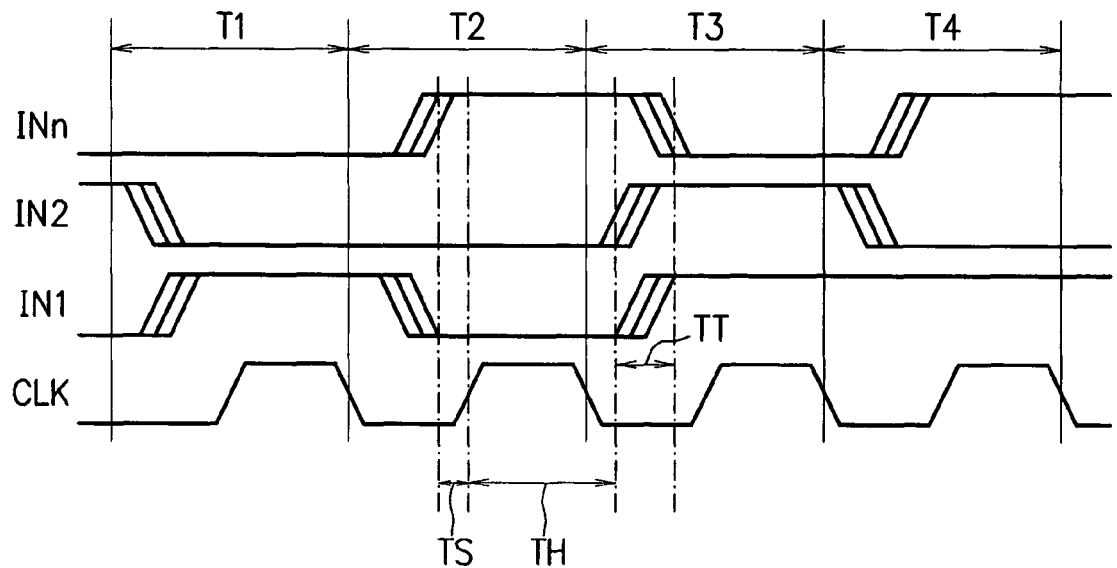
FIG. 8 is a timing chart showing an example data input signal and an example clock signal.
Figure 9:
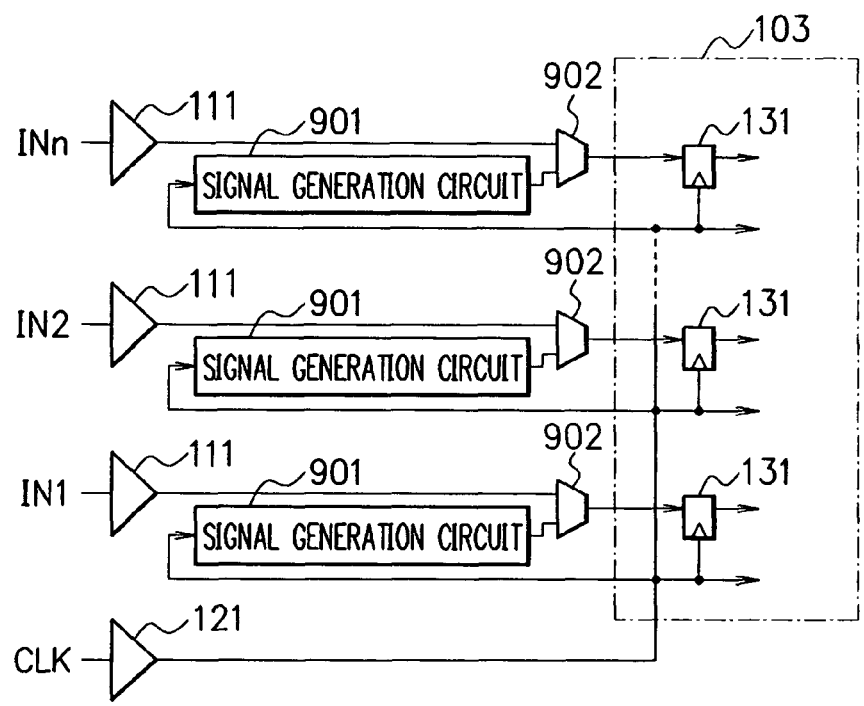
FIG. 9 is a circuit diagram of the semiconductor integrated circuit including signal generation circuits for the test.

FIG. 1 is a view showing a configuration example of a semiconductor integrated circuit 101 according to a first embodiment of the present invention. A testing equipment 102 is connected to the semiconductor integrated circuit 101. The testing equipment 102 can output three types of data input signals IN1 to INn shown in FIG. 6, namely a Non-Return to Zero signal, a Return to Zero signal and a short-pulse signal, to the semiconductor integrated circuit 101. Further, the testing equipment 102 can output the data input signals IN1 to INn and a clock signal CLK shown in FIG. 8 to the semiconductor integrated circuit 101. Here, in the present embodiment, as data input signals IN1 to INn, the Return to Zero signal having the short pulse width or the short-pulse signal is used to perform a high frequency test on the input circuits 111. At that time, the clock signal CLK is a signal having the same or higher frequency as of the data input signals IN1 to INn.

The semiconductor integrated circuit 101 includes n-pieces of data input circuits 111, n-pieces of counters 112, n-pieces of matching circuits 113, n-pieces of mode setting registers 114, n-pieces of matching result registers 115, n-pieces of expectation value registers 116, a single piece of clock input circuit 121 and a single piece of internal logic circuit 103. The internal logic circuit 103 includes n-pieces of flip-flops 131.

The data input signals IN1 to INn are inputted into data input terminals of the n-pieces of flip-flops 131 via the data input circuits 111. The clock signal CLK is inputted into clock terminals of the n-pieces of flip-flops 131 via the input circuit 121. In synchronization with a rising edge, the n-pieces of flip-flops 131 latch to memorize the data input signals IN1 to INn of the clock signal CLK.

The n-pieces of data input circuits 111 input and output the n-pieces of data input signals IN1 to INn from the testing equipment (outside) 102, respectively. The clock input circuit 121 inputs and outputs the clock signal CLK from the (external) testing equipment 102. The mode setting register 114 is a register to set a mode. The counter 112 counts the rising number of the output signal of the data input circuit 111, the falling number thereof, or the rising number and the falling number thereof in accordance with the mode of the mode setting registers 114. A tester can control the operation of the counter 112 by setting the mode of the mode setting register 114. The counter 112 counts the switching number of the output signal of the data input circuit 111. The data input signals IN1 to INn used in the test are predetermined signals, so that the number the counter 112 is to count is known in advance. From a different viewpoint, the pulse numbers of the data input signals IN1 to INn are determined in advance. The expectation value register (comparison value register) 116 memorizes an expectation value (comparison value) of the number counted by its counter 112. The matching circuit (comparing circuit) 113 compares the number counted by the counter 112 and the expectation value memorized by the expectation value register 116 to output a matching signal or an unmatching signal. The matching circuit 113 is caused to output the matching signal when the data input circuit 111 is normal, and to output the unmatching signal when the data input circuit 111 is abnormal. The matching circuit 113 can be realized using an exclusive OR circuit. The matching result register 115 (comparison result register) memorizes the comparison result of the matching circuit 113.

The group of the data input circuit 111, the counter 112, the matching circuit 113, the mode setting register 114, the expectation value register 116 and the matching result register 115 is provided for each data input signals IN1 to INn, and therefore n groups (two or more groups) are provided in total. The n-pieces of expectation value registers 116 are connected in series and serially input expectation value information S1 from the testing equipment 102. Further, the n-pieces of mode setting registers 114 are connected in series and serially input mode setting information S1 from the testing equipment 102. Further, the n-pieces of matching result registers 115 are connected in series and serially output the comparison result to the testing equipment 102 as a result signal S3.

Figure 2:
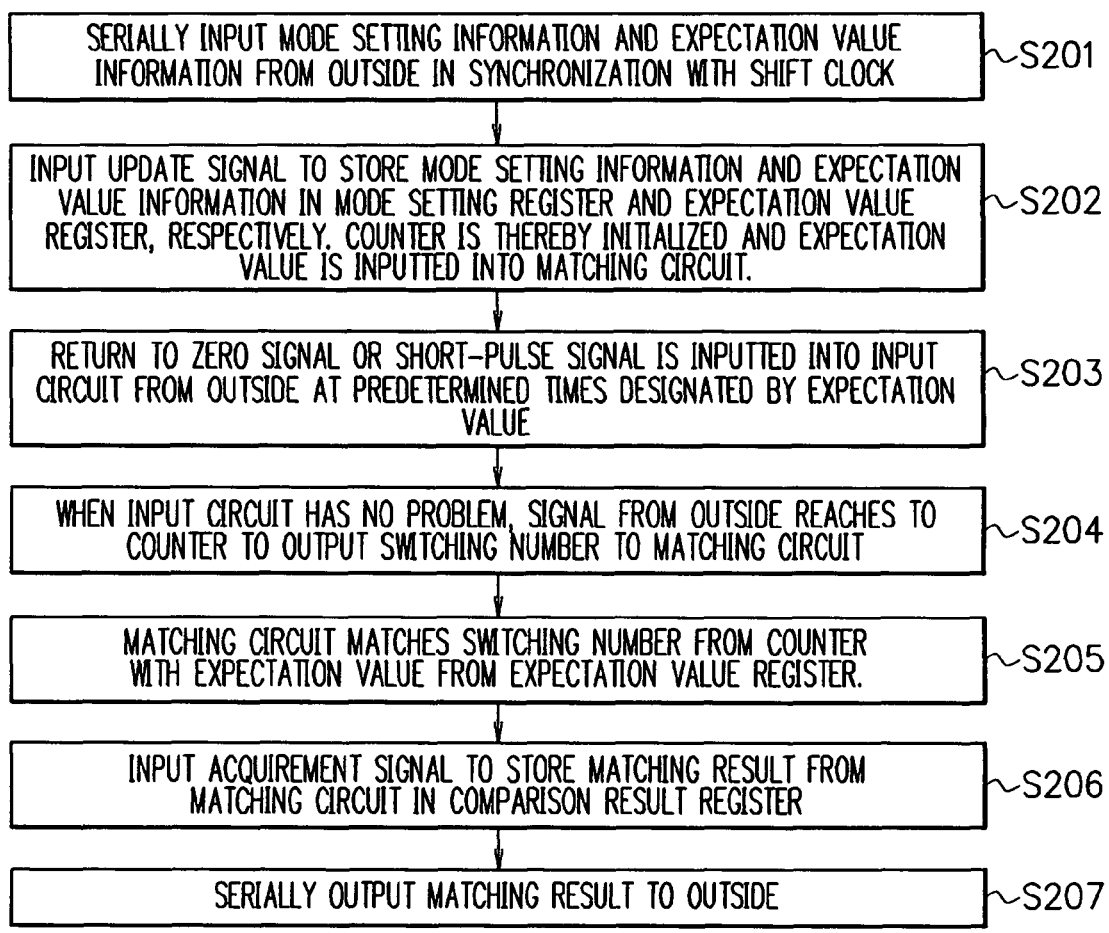
FIG. 2 is a flowchart showing a test method of the semiconductor integrated circuit by testing equipment in FIG. 1.

FIG. 2 is a flowchart showing a test method of the semiconductor integrated circuit 101 by the testing equipment 102 in FIG. 1.

First, in Step S201, the testing equipment 102 outputs the mode setting information S1 and a shift clock signal S2 to the n-pieces of mode setting registers 114 connected in series and outputs the expectation value information S1 and the shift clock signal S2 to the n-pieces of expectation value registers 116 connected in series. In synchronization with the shift clock signal S2, the n-pieces of mode setting registers 114 serially input the mode setting information S1. In synchronization with the shift clock signal S2, the n-pieces of expectation value registers 116 serially input the expectation value information S1.

Subsequently, in Step S202, the testing equipment 102 outputs an update signal S2 to the n-pieces of mode setting registers 114 and the n-pieces of expectation value registers 116. Then, the n-pieces of mode setting registers 114 store (record) the serially inputted mode setting information S1 and the n-pieces of expectation value registers 116 store (record) the serially inputted expectation value information S1. The counters 112 are initialized in response to the storages of the mode setting registers 114. The matching circuits 113 input the expectation value from the expectation value register 116, respectively.

Subsequently, in Step S203, the testing equipment 102 outputs the n-pieces of data input signals IN1 to INn respectively to the corresponding n-pieces of data input circuits 111, and outputs the clock signal CLK to the clock input circuit 121. The data input signals IN1 to INn are the Return to Zero signal having the short pulse width or the short-pulse signal respectively shown in FIG. 6 that switches such a number of times as designated by the expectation value in the expectation value register 116.

Subsequently, in Step S204, the n-pieces of counters 112 count the switching numbers of the output signals of the n-pieces of data input circuits 111 based on the mode setting information of the mode setting registers 114. When the data input circuits 111 have no problem, the data input signals IN1 to INn from the testing equipment 102 reach to the counters 112. The counter 112 counts the switching number being the same as the expectation value of the expectation value register 116 when the data input circuit 111 is normal, or counts the switching number different from the expectation value when the data input circuit 111 is abnormal, to thereby outputs to the mode setting register 114.

Subsequently, in Step S205, the matching circuit 113 matches (compares) the switching number outputted by the counter 112 and the expectation value outputted by the expectation register 116 to output the matching result (comparison result) to the matching result register 115.

Subsequently, in Step S206, the testing equipment 102 outputs an acquirement signal S2 to the n-pieces of the matching result registers 115. Then, the n-piece of matching result registers 115 store (record) the corresponding matching results outputted from the corresponding n-pieces of matching circuits 113, respectively.

Subsequently, in Step S207, the testing equipment 102 outputs the shift clock signal S2 to the n-pieces of the matching result registers 115. Then, in synchronization with the shift clock signal S2, the n-pieces of matching result registers 115 serially output n-pieces of matching result S3 to the testing equipment 102. With this, the testing equipment 102 can recognize the test results (normal or abnormal) of the n-pieces of data input circuits 111 to identify the abnormal data input circuit 111 when there is any abnormality.

As described above, according to the present embodiment, the Return to Zero signal having the pulse width shorter than that of the Non-Return to Zero signal or the short-pulse signal can be used as data input signals IN1 to INn. With the counter 112 counting the switching number of the data input signal outputted by the data input circuit 111, an operation check test on the data input circuit 111 is allowed. The Return to Zero signal having the short pulse width or the short-pulse signal can be used as data input signals IN1 to INn, so that the test of the data input circuits 111 when inputting the data input signals IN1 to INn having the short pulse width can be performed appropriately.

Second Embodiment

Figure 3:
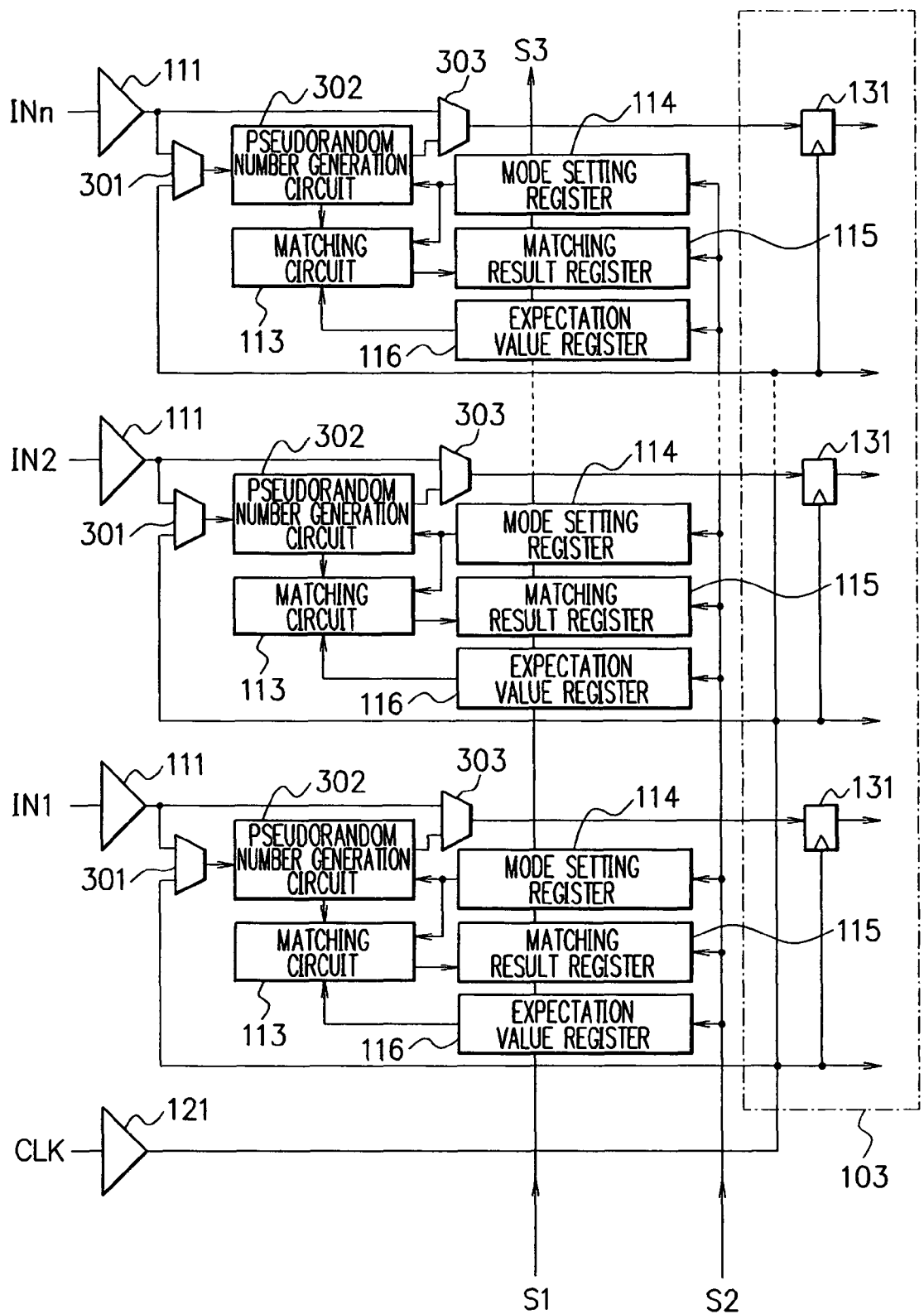
FIG. 3 is a view showing a configuration example of a semiconductor integrated circuit according to a second embodiment of the present invention.

FIG. 3 is a view showing a configuration example of a semiconductor integrated circuit according to a second embodiment of the present invention, in which a pseudorandom number generation circuits 302 are provided in place of the counters 112 and n-pieces of first selectors 301 and n-pieces of second selectors 303 are added, compared with the semiconductor integrated circuit 101 in FIG. 1. Hereinafter, the description will be given of differences between the present embodiment and the first embodiment.

Each of the n-pieces of first selectors 301 selects the output signal (data input signal) of the corresponding n-pieces of data input circuits 111 or the output signal (clock signal) of the clock input circuit 121 to output the signal to the corresponding n-pieces of the pseudorandom number generation circuits 302. Based on the mode setting information of the mode setting register 114, the pseudorandom number generation circuit 302 generates a pseudorandom number in accordance with the switching number of the output signal of the first selector 301. The detail thereof will be described later with reference to FIG. 4. Each of the n-pieces of second selectors 303 selects the output signal of the corresponding data input circuit 111 or the output signal of the corresponding pseudorandom number generation circuit 302 to output the signal to the data input terminal of the corresponding fillip-flop 113 out of the n-pieces of flip-flops 131. The n-pieces of flip-flops 131 in the internal logic circuit 103 input n-pieces of output signals of the second selectors 303. Each of the n-pieces of matching circuits 113 matches (compares) the pseudorandom number outputted by the corresponding pseudorandom number generation circuits 302 and the expectation value outputted by the corresponding expectation value register 116. The expectation value register 116 stores the expectation value of the pseudorandom number. The pseudorandom number is the pseudorandom number in accordance with the output signal of the selector 301, so that the expectation value thereof is known beforehand.

Figure 4:
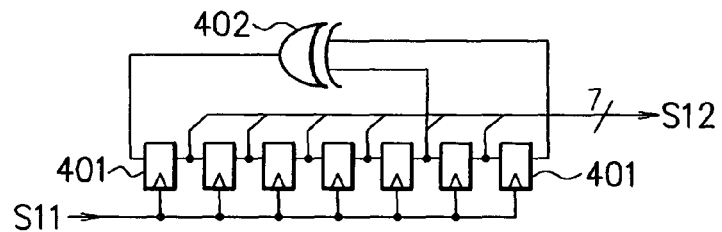
FIG. 4 is a circuit diagram showing a configuration example of a pseudorandom number generation circuit.

FIG. 4 is a circuit diagram showing a configuration example of the pseudorandom number generation circuit 302 in FIG. 3. The pseudorandom number generation circuit 302 includes, for example, 7-pieces of flip-flops 401 and an exclusive OR circuit 402. Data input terminals and data output terminals of the 7-pieces of flip-flops 401 are connected in series and clock terminals thereof are connected to an input signal S11. The input signal S11 is the output signal of the selector 301. The exclusive OR circuit 402 outputs an exclusive OR signal, for example, of an output signal of the fifth flip-flop 401 and an output signal of the seventh flip-flop 401 to the data input terminal of the first flip-flop 401. The 7-pieces of flip-flops 401 latch to memorize the signal inputted to the respective data input terminals in synchronization with the input signal S11. An output signal S12 is the output signal of the respective 7-pieces of flip-flops 401 and is a 7-bit parallel signal.

Each of the n-pieces of selectors 301 selects the corresponding data input signal IN1 to INn outputted by the corresponding data input circuit 111 or the clock signal outputted by the clock input circuit 121 to output the signal as a signal S11. The switching number(s) of the data input signals IN1 to INn and the clock signal CLK at the test is/are determined in advance. Accordingly, the switching number of the output signal of the selector 301 is known in advance. The pseudorandom number generation circuit 302 outputs a pseudorandom number S12 in accordance with the switching number of the signal S11. The pseudorandom number S12 is a unique number determined in accordance with the switching number of the signal S11. Accordingly, when the switching number of the input signal S11 is known beforehand, the expectation value of the pseudorandom number S12 corresponding to the input signal S11 is known beforehand. The expectation value is stored in the expectation value register 116.

The mode setting register 114 memorizes the mode setting information. Based on the mode setting information of the mode setting register 114, the pseudorandom number generation circuit 302 generates the pseudorandom number S12 in accordance with the rising number of the output signal S11 of the selector 301, the falling number thereof, or the rising number and falling number thereof. Specifically, based on the mode setting information of the mode setting register 114, the flip-flop 401 latches in synchronization with the rising number of the output signal S11 of the data input circuit 301, the falling number thereof, or the rising number and the falling number thereof. Further, when the mode setting information is newly stored in the mode setting register 114, the pseudorandom number generation circuit 302 is initialized.

The pseudorandom number generation circuit 302 outputs, for example, the 7-bit pseudorandom number signal S12 to the matching circuit 113. The expectation value register 116 memorizes the expectation value of the 7-bit pseudorandom number to output the value to the matching circuit 113. The matching circuit 113 compares the 7-bit output signal S12 outputted by the pseudorandom number generation circuit 302 and the 7-bit output signal outputted by the expectation value register 116 to output the comparison result to the matching result register 115.

Further, the pseudorandom number generation circuit 302 outputs 1-bit signal out of the 7-bit signal S12 to the selector 303. The selector 303 selects the 1-bit signal outputted by the data input circuit 111 or the 1-bit signal outputted by the pseudorandom number generation circuit 302 to output the signal to the flip-flop 131.

As described above, in the present invention, the pseudorandom number generation circuits 302 are provided in the semiconductor integrated circuit. The n-pieces of pseudorandom number generation circuits 302 in the semiconductor integrated circuit can generate the pseudorandom number signals having smaller phase variation. With the selector 303 selecting the output signal of the pseudorandom number generation circuit 302, the internal logic circuit 103 can input the signals having smaller phase variation from the pseudorandom number generation circuits 302, allowing the test to be performed.

Meanwhile, when the selector 301 selects the output signal of the data input circuit 111, the pseudorandom number generation circuit 302 generates the pseudorandom number in accordance with the output signal of the data input circuit 111, allowing testing the data input circuit 111. On the other hand, when the selector 301 selects the output signal of the clock input circuit 121, the pseudorandom number generation circuit 302 generates the pseudorandom number in accordance with the output signal of the clock input circuit 121, allowing testing the clock input circuit 121.

Furthermore, when the selector 303 selects the output signal of the data input circuit 111, the internal logic circuit 103 can test using the output signal of the data input circuit 111. On the other hand, when the selector 303 selects the output signal of the pseudorandom number generation circuit 302, the internal logic circuit 103 can test using the output signal of the pseudorandom number generation circuit 302. Not that, in a normal operation after the test, the selector 303 selects the output signal of the data input circuit 111.

Third Embodiment

Figure 5:
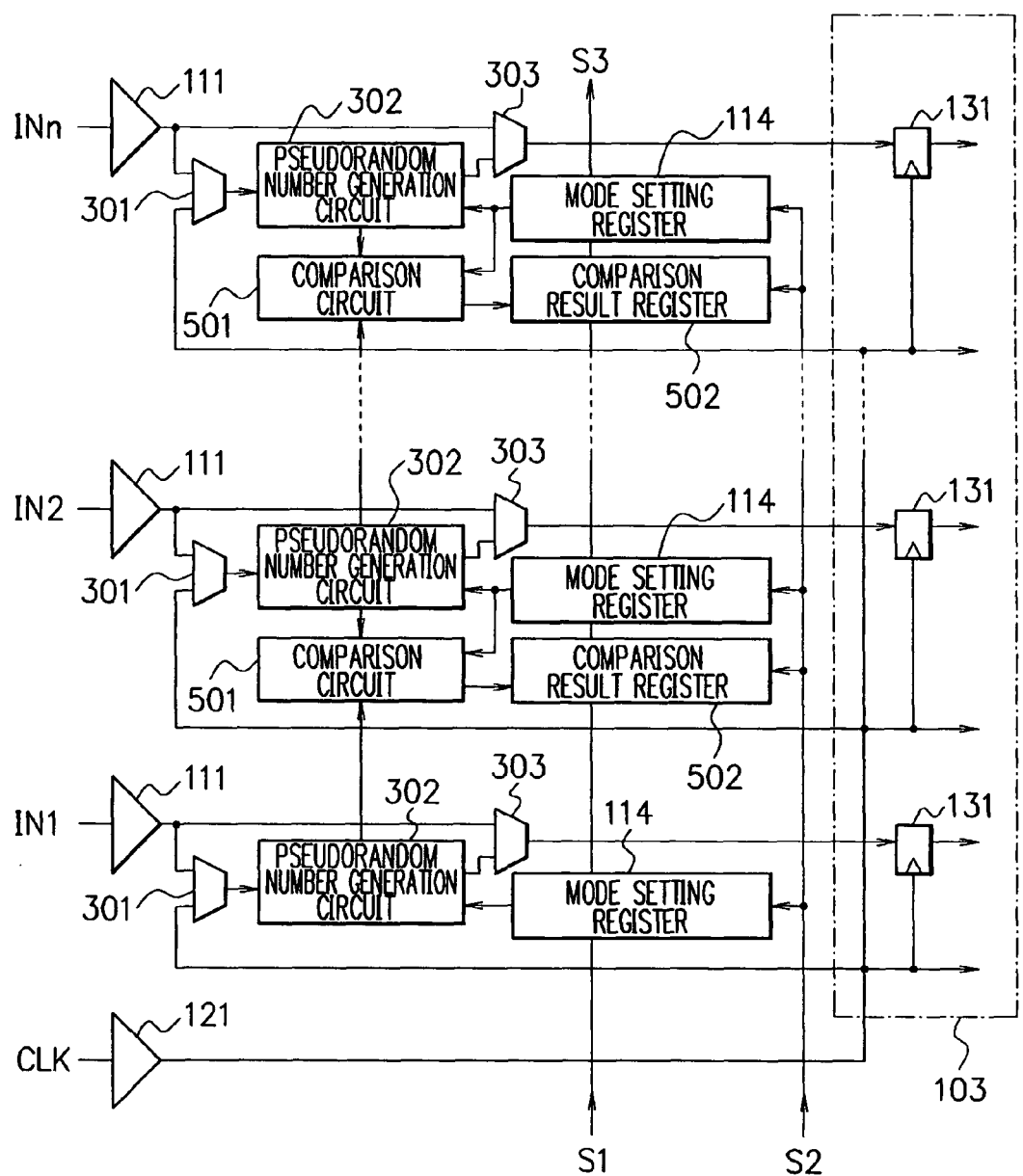
FIG. 5 is a view showing a configuration example of a semiconductor integrated circuit according to a third embodiment of the present invention.

FIG. 5 is a view showing a configuration example of a semiconductor integrated circuit according to a third embodiment, in which comparing circuits 501 and comparison result registers 502 are provided in place of the matching circuits 113 and the matching result registers 115 and the n-pieces of expectation value registers 116 are removed compared with the semiconductor integrated circuit in FIG. 3. Hereinafter, the description will be given of differences between the present embodiment and the second embodiment.

At the time of the test, the n-pieces of data input signals IN1 to INn to be inputted are the same signal each other. As a result, when the n-pieces of selectors 301 select the outputs signal of the respective data input circuits 111, all the n-pieces of the pseudorandom number generation circuits 302 output the same pseudorandom number signals as long as the n-pieces of data input circuits 111 are normal.

The semiconductor integrated circuit includes n−1 pieces of the comparing circuits 501. The first comparing circuit 501 compares the pseudorandom number signal outputted by the pseudorandom number generation circuit 302 corresponding to the data input signal IN1 and the pseudorandom number signal outputted by the pseudorandom number generation circuit 302 adjacent thereto and corresponding to the data input signal IN2. Further, the second comparing circuit 501 compares the pseudorandom number signal outputted by the pseudorandom number generation circuit 302 corresponding to the data input signal IN2 and the pseudorandom number signal outputted by the pseudorandom number generation circuit 302 adjacent thereto and corresponding to the data input signal IN3. Similarly, the (n−1) rd comparing circuit 501 compares the pseudorandom number signal outputted by the pseudorandom number generation circuit 302 corresponding to the data input signal INn−1 and the pseudorandom number outputted by the pseudorandom number generation circuit 302 adjacent thereto and corresponding to the data input signal INn. As in the matching circuit 113, the comparing circuit 501 can be realized by using the exclusive OR circuit.

As described above, when all the n-pieces of data input circuits 111 are normal, all the n-pieces of pseudorandom number generation circuits 302 generate the same pseudorandom number signals. In that case, all the n-pieces of comparing circuits 501 output a matching signal to the corresponding n-pieces of comparison result registers 502, respectively.

When there exists an abnormal one in the data input circuits 111, then the pseudorandom number generation circuit 302 inputting the signal from the abnormal data input circuit 111 outputs the pseudorandom number signal different from that outputted from the pseudorandom number generation circuit 302 inputting the signal from the normal data input circuit 111. In that case, the comparing circuit 501 inputting the pseudorandom number of the abnormal one outputs the unmatching signal to the comparison result register 502.

The n-pieces of comparison result registers 502 are connected in series as in the comparison result registers 115 in FIG. 3, and serially outputs the comparison result to the testing equipment 102 as a comparison result signal S3. The testing equipment 102 performs the operation check test based on the comparison result signal S3, and when there is found any abnormality as a result of the test, the abnormal data input circuit 111 can be recognized.

As described above, in the present embodiment, the expectation value registers 116 can be removed compared with the second embodiment. The comparing circuit 501 compares the pseudorandom number signals generated by the mutually adjacent two pseudorandom number generation circuits 302.

Note that, for the counter 112 in the first embodiment and the pseudorandom number generation circuit 302 in the second and third embodiments, the holding circuit holding the value in accordance with the switching number of the output signal of the data input circuit 111 or the clock input circuit 121 is acceptable. Specifically, the pseudorandom number generation circuits 302 may be used in place of the counters 112 in the first embodiment and the counters 112 may be used in place of the pseudorandom number generation circuits 302 in the second and third embodiment.

The semiconductor integrated circuit 101 according to the first to third embodiments includes the data input circuits 111 inputting the data input signals IN1 to INn from outside and outputting them, respectively, and the comparing circuits (matching circuits) 113 or 501 each comparing the value in accordance with the switching number of the output signal of the data input circuit 111 and the expectation value (comparison value).

Further, the semiconductor integrated circuit 101 according to the first and second embodiments includes the holding circuits 112 or 302 each holding the value in accordance with the switching number of the output signal of the data input circuit 111, the comparison value registers 116 each memorizing the comparison value (expectation value), and the comparison result registers 115 each memorizing the comparison result of the comparing circuit (matching circuit) 113. The comparing circuit 113 compares the value held by the holding circuit 112 or 302 and the comparison value memorized by the comparison value register 116.

In the first embodiment, the holding circuit is the counter 112 counting the switching number of the output signal of the data input circuit 111 and the comparing circuit 113 compares the number counted by the counter 112 and the comparison value.

In the second embodiment, the holding circuit is the pseudorandom number generation circuit 302 generating the pseudorandom number in accordance with the switching number of the output signal of the data input circuit 111, and the comparing circuit 113 compares the pseudorandom number and the comparison value.

In the third embodiment, the data input circuits 111 inputting the data input signals IN1 to INn from outside and outputting them and the holding circuits (pseudorandom number generation circuits 302 or counters 112) each holding the value in accordance with the switching number of the output signal of the data input circuit 111 are provided, and each of the first and second groups includes the data input circuit 111 and the holding circuit 302 or 112, respectively. The comparing circuit 501 compares the value held by the holding circuit 302 or 112 of the first group and the value held by the holding circuit 302 or 112 of the second group.

In the first to third embodiments, the high-speed test can be performed by inputting the Return to Zero signals or the short-pulse signals to the data input circuits 111. According to the above-described embodiments, the higher-speed test can be performed with respect to the data input circuits 111 by use of the general testing equipment 102.

In should be noted that any of the above-described embodiments are merely concrete examples to implement the present invention, and it is to be understood that the technical scope of the present invention will not be construed restrictive by these embodiments. In other words, the present invention can be realized in various forms without departing from the technological spirit and the main features thereof.

It is possible to input the data input signal having the short pulse width into the data input circuit, so that the test of the data input circuit when inputting the data input signal having the short pulse can be performed appropriately.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor integrated circuit comprising:
a data input circuit to receive a data input signal from outside and to output an output signal;
a comparison value register to memorize an expectation value of the number of rising edges, the number of falling edges, or the number of rising edges and falling edges of the output signal of the data input circuit varying in accordance with the data input signal of the data input circuit;
a clock input circuit to receive a first clock signal from outside to output a second clock signal;
a first selector to selectively output the output signal of the data input circuit or the second clock signal;
a holding circuit to hold the number of rising edges, the number of falling edges, or the number of rising edges and falling edges of an output signal of the first selector;
a comparing circuit to compare the expectation value and the number held by the holding circuit;
a second selector to selectively output the output signal of the data input circuit or an output signal of the holding circuit; and
a logic circuit to receive the output signal of the second selector.

2. A semiconductor integrated circuit comprising:
a first data input circuit to receive a data input signal from outside and to output a first output signal;
a first pseudorandom number generating circuit to generate a first pseudorandom number in accordance with the number of rising edges, the number of falling edges, or the number of rising edges and falling edges of the first output signal of the first data input circuit;
a second data input circuit to receive a data input signal from outside and to output a second output signal;
a second pseudorandom number generating circuit to generate a second pseudorandom number in accordance with the number of rising edges, the number of falling edges, or the number of rising edges and falling edges of the second output signal of the second data input circuit; and
a comparing circuit to compare the first pseudorandom number and the second pseudorandom number.

3. The semiconductor integrated circuit according to claim 2, further comprising a comparison result register memorizing a comparison result of the comparing circuit.

4. The semiconductor integrated circuit according to claim 2,
wherein the comparing circuit is a first comparing circuit, and
wherein the semiconductor integrated circuit further comprises:
a third data input circuit to receive a data input signal from outside and to output a third output signal;
a third pseudorandom number generating circuit to generate a third pseudorandom number in accordance with the number of rising edges, the number of falling edges, or the number of rising edges and falling edges of the third output signal of the third data input circuit;
a second comparing circuit to compare the second pseudorandom number and the third pseudorandom number;
a first comparison result register to memorize a comparison result of the first comparing circuit; and
a second comparison result register to memorize a comparison result of the second comparing circuit, and
wherein the first and second comparison result registers are connected in series to serially output the comparison result.

5. A semiconductor integrated circuit comprising:
a data input circuit to receive a data input signal from outside and to output an output signal;
a comparison value register to memorize an expectation value of the number of rising edges, the number of falling edges, or the number of rising edges and falling edges of the output signal of the data input circuit varying in accordance with the data input signal of the data input circuit;
a holding circuit to hold the number of rising edges, the number of falling edges, or the number of rising edges and falling edges of the output signal of the data input circuit;
a comparing circuit to compare the number held by the holding circuit and the expectation value memorized by the comparison value register; and
a comparison result register to memorize a comparison result of the comparing circuit, wherein a plurality of groups each composed of a data input circuit, a holding circuit, a comparing circuit, a comparison value register and a comparison result register is provided, wherein the plurality of the comparison value registers are connected in series and serially input the expectation value from an external circuit, and wherein the plurality of the comparison result registers are connected in series and the comparison results in the plurality of the comparison result registers are serially outputted to the external circuit.

6. A semiconductor integrated circuit comprising:

a data input circuit to receive a data input signal from outside and to output an output signal;

a comparison value register to memorize an expectation value of the number of rising edges, the number of falling edges, or the number of rising edges and falling edges of the output signal of the data input circuit varying in accordance with the data input signal of the data input circuit;

a holding circuit to hold the number of rising edges, the number of falling edges, or the number of rising edges and falling edges of the output signal of the data input circuit;

a comparing circuit to compare the expectation value and the number held by the holding circuit; and a comparison result register to memorize a comparison result of the comparing circuit, wherein a plurality of groups each composed of a data input circuit, a holding circuit, a comparing circuit, a comparison value register and a comparison result register is provided, and wherein the data input circuits, the holding circuits, the comparing circuits, the comparison value registers and the comparison result registers of the plurality of groups are provided at a plurality of input sections of a serial data input circuit, respectively.

* * * * *